United States Patent
Fukuoka

(10) Patent No.: US 6,327,186 B1
(45) Date of Patent: *Dec. 4, 2001

(54) NON-VOLATILE SEMICONDUCTOR MEMORY INCLUDING MEMORY CELLS HAVING DIFFERENT CHARGE EXCHANGE CAPABILITY

(75) Inventor: Ikuto Fukuoka, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/326,619

(22) Filed: Jun. 7, 1999

(30) Foreign Application Priority Data

Dec. 17, 1998 (JP) .................................................. 10-358731

(51) Int. Cl.$^7$ ...................................................... G11C 16/04
(52) U.S. Cl. ................................ 365/185.26; 365/185.01; 365/185.04
(58) Field of Search .................... 365/185.26, 185.29, 365/185.27, 185.01, 52, 49, 185.09, 185.17, 185.04; 275/322

(56) References Cited

U.S. PATENT DOCUMENTS

| | | | |
|---|---|---|---|
| 5,504,760 | * 4/1996 | Harari et al. | 371/40.1 |
| 5,586,073 | * 12/1996 | Hiura et al. | 365/185.01 |
| 5,592,003 | * 1/1997 | Sato et al. | 275/322 |
| 5,768,191 | * 6/1998 | Choi et al. | 365/185.22 |
| 5,822,248 | * 10/1998 | Satori et al. | 365/185.21 |
| 5,867,428 | * 2/1999 | Ishii et al. | 365/185.24 |
| 5,905,676 | * 5/1999 | Ohwa | 365/185.21 |
| 5,996,108 | * 11/1999 | Tanzawa et al. | 714/773 |
| 6,134,141 | * 10/2000 | Wong | 365/185.03 |

FOREIGN PATENT DOCUMENTS 58-225672   12/1983   (JP) .

* cited by examiner

*Primary Examiner*—David Nelms
*Assistant Examiner*—Thong Le
(74) *Attorney, Agent, or Firm*—Staas & Halsey LLP

(57) ABSTRACT

According to the present invention, the above-described objects can be achieved by a semiconductor storage device including: memory cells for storing data by accumulating or not accumulating charges, such as electrons, into floating gate; wherein the memory cell includes first memory cells having first charge exchange capability with respect to a charge exchange for the floating gate, and second memory cells having second charge exchange capability, so that data to be returned can be stored. In the semiconductor storage device according to the present invention, when all erase or all write (program) is performed to the memory cells, the first memory cells become to have a different threshold voltage from the second memory cells according to the different charge exchange capability of the memory cells, thus data to be returned can be read out. In a semiconductor storage device according to the present invention including memory cells for storing data by accumulating or not accumulating electrons on a floating gate FG, data to be returned can be stored by using the memory cells as first memory cells Q2 having a first charge exchange capability and second memory cells Q3 having a second charge exchange capability. The memory cell scan maintain a different threshold voltage according to different charge exchange capabilities of the memory cell, and therefore, it becomes possible to read out the initial data to be returned by all erasing to the memory cells.

12 Claims, 6 Drawing Sheets

Applicable example

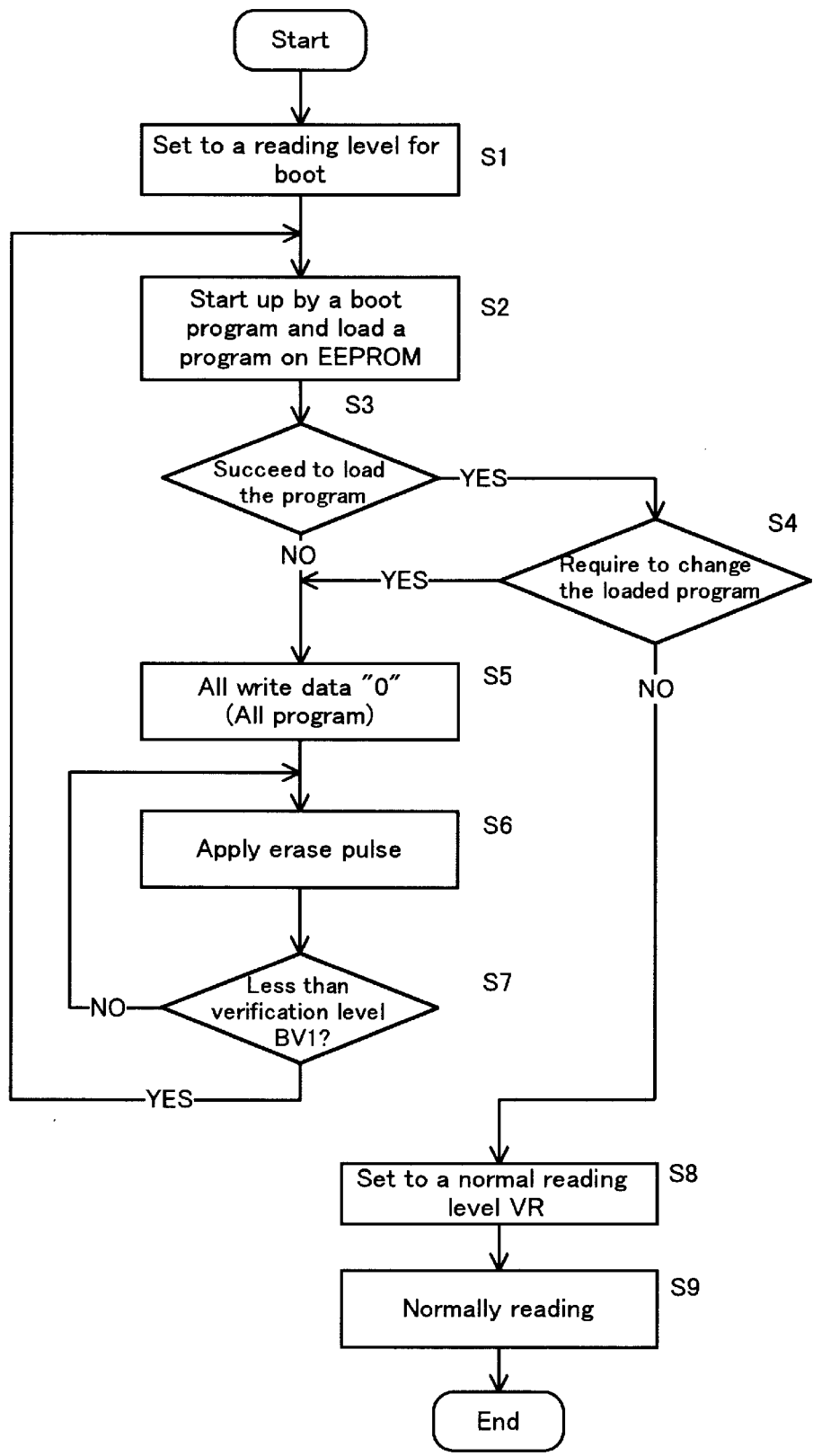

NON-VOLATILE SEMICONDUCTOR MEMORY INCLUDING MEMORY CELLS HAVING DIFFERENT CHARGE EXCHANGE CAPABILITY

BACKGROUND OF THE INVENTION

1. Field of the Invention

The present invention relates to a non-volatile semiconductor memory whereby data is stored by accumulating or not accumulating charges into a floating gate, and more particularly, to a non-volatile semiconductor storage device whereby prescribed initial data can be read out again, even after a normal writing or erasing operation is executed.

2. Description of the Related Art

An EEPROM including memory cells each having a floating gate is employed as a non-volatile semiconductor storage device to store data or program to be stored for a long time, because storage data or program is not lost even when a power is OFF. The EEPROM is also employed as a flash memory which can erase data in each prescribed block. For example, the flash memory is employed as a memory for program built-in a micro-processor.

To write data or program in a non-volatile semiconductor storage device (hereinafter it called a flash memory, for example, for simplicity) built in a micro processor and so on, there are various methods, for example: first is to write data or program by employing an externally provided writing device, second is to write a boot program once by employing an externally provided writing device and to write (down load) the original data or program by the use of the written boot program after that; and third is to provide a ROM storing the above-described boot program and employ the boot program stored in the ROM so as to write (down load) the original data or program into the flash memory, and so on.

The first method can not be used in real because of the many steps necessary for writing data or program. Additionally, the third method must be avoided, since the additional ROM for storing the boot program to down load data or program must be provided. Therefore, the second method is most effective and lower cost.

However, in order to down load data or program having large capacity by employing a capacity of flash memory to the maximum, the data or program must be over-written in an area storing the prescribed boot program. Since the boot program will never be used after down loading the data or program once, there is no problem to over-write the data or program in the boot program area.

However, it can happen that the written data or program should be changed after over-writing it in the area storing the boot program. Or it also can happen that some operations failures occur during down loading data or program, then, the down loading can not be properly completed. In these cases, since the boot program is already erased, even though it is necessary to down load the data or program again, the boot program for down loading does not exist, thus the data or program can not be written to a micro processor.

SUMMARY OF THE INVENTION

Accordingly, it is an object of the present invention to provide a non-volatile semiconductor memory wherein initial data can be read out after erasing the initial data, such as a boot program, by mistake.

It is another object of the present invention to provide a non-volatile semiconductor memory wherein memory cells can be returned to a state before over-writing, even after over-written prescribed data, so that the storage data before over-writing can be read out.

It is further object of the present invention to provide a micro processor having a non-volatile semiconductor memory to achieve the above-described objects.

According to the present invention, the above-described objects can be achieved by a semiconductor memory including: memory cells for storing data by accumulating or not accumulating charges, such as electrons, into floating gate; wherein the memory cell includes first memory cells having first charge exchange capability with respect to a charge exchange for the floating gate, and second memory cells having second charge exchange capability, so that data to be returned can be stored. In the semiconductor storage device according to the present invention, when all erase or all write (program) is performed to the memory cells, the first memory cells become to have a different threshold voltage from the second memory cells according to the different charge exchange capability of the memory cells, thus data to be returned can be read out.

To achieve the above-described objects, according to the first aspect of the present invention, a non-volatile semiconductor memory including plural memory cells for storing data by accumulating charges into a floating gate, comprises: a first memory cell group including memory cell having first charge exchange capability and a second memory cell group including memory cell having second charge exchange capability higher than the first charge exchange capability.

In the above-described invention, according to one embodiment, the memory cell is formed at a surface of a first conductive type semiconductor substrate, and the memory cell includes second conductive type source and drain regions formed at the surface of the semiconductor substrate, a floating gate formed over a first conductive type channel region between the source and drain regions, and a control gate formed over the floating gates, wherein the channel region of the memory cell in the first memory cell group has different impurity concentration than the channel region of the memory cell in the second memory cell group.

Additionally, in the above-described invention, according to one embodiment, the memory cell includes a control gate over the floating gate, the memory device further comprises a read level generator for applying a first read electric potential to the control gate during a first read operation, and applying a second read electric potential different from the first read electric potential to the control gate during a second read operation different from the first read operation.

To achieve the above-described objects, according to the second aspect of the present invention, a non-volatile semiconductor memory including plural memory cells for storing data by accumulating charges into floating gates, comprises a first memory area including first memory cells having first charge exchange capability with respect to a charge exchange to the floating gate, and second memory cells having second charge exchange capability higher than the first charge exchange capability, and a second memory area including memory cells having either the first or second charge exchange capability.

In the above-described invention, according to an embodiment, the memory cell includes a control gate over the floating gate, wherein the first data is read by applying a first read-out electric potential to the control gate during a first reading, and second data according to a state of accumulated charges in the floating gate is read by applying a second read-out electric potential different from the first read electric potential to the control gate during a second reading different from the first reading.

In the above-described invention, according to an embodiment, the first data includes an error detection code, the first data is read out by employing the error detection code during the first data reading.

To achieve the above-described objects, according to another aspect of the present invention, a micro processor includes a non-volatile memory area having plural memory cells for storing data by accumulating charges in floating gate, wherein the non-volatile memory area comprises a first memory area including first memory cells having first charge exchange capability with respect to a charge exchange for the floating gate, and second memory cells having second charge exchange capability higher than the first charge exchange capability, and a second memory area including memory cells having either the first or second charge exchange capability, wherein a boot program is recorded in the first memory area according to a combination of the first and second memory cells.

According to the present invention, it becomes possible to return a boot program even after over-writing.

BRIEF DESCRIPTION OF THE PRESENT INVENTION

FIG. 7 shows an operational flow chart when returning the boot program in the applicable example of FIG. 6.

DESCRIPTION OF THE PREFERRED EMBODIMENTS

Hereinafter, preferred embodiments of the present invention are described with reference to the drawings. However, the technical scope of the present invention is not limited to these embodiments.

Figure 1:
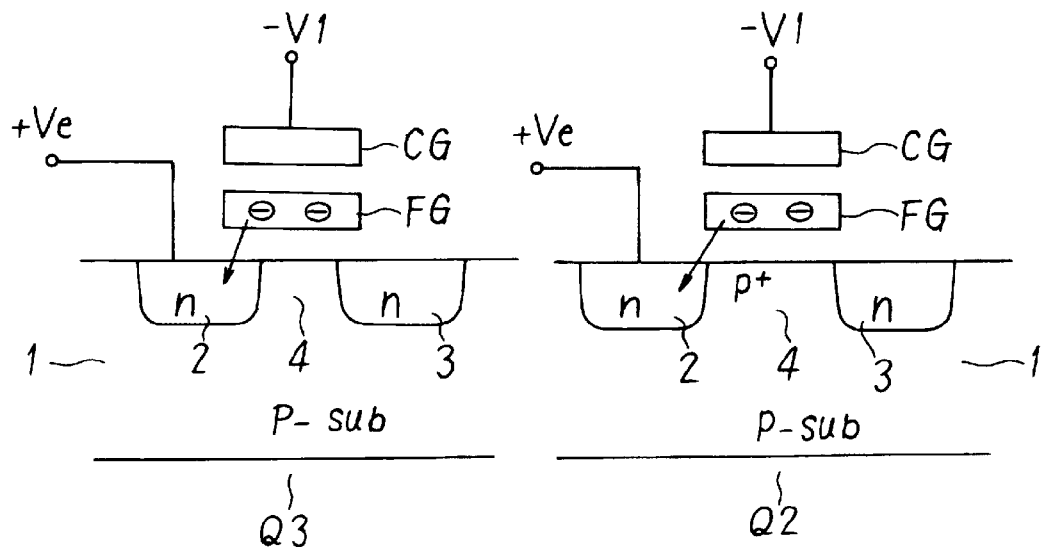
FIG. 1 is a cross sectional view showing an example of a memory cell having different charge exchange capability according to an embodiment.

FIG. 1 is a cross-sectional view showing an example of a memory cell having different charge exchange capability according to an embodiment. Each memory cell Q2 and Q3 shown in FIG. 1 includes N type source and drain regions 2 and 3 provided at a surface of a P type semiconductor substrate 1. Each memory cell Q2 and Q3 further includes a floating gate FG provided on a channel region 4 between the N type source and drain regions 2 and 3 through an insulating film, and a control gate CG provided on the floating gate FG through the other insulating film.

A threshold voltage becomes higher by injecting electrons to the floating gates FG of the memory cells Q2 and Q3, and the threshold voltage becomes lower by drawing the injected electrons away from the floating gate, for example. The electrons are injected from the channel regions to the floating gate FG, when the drain region 3 is set to a high voltage, the source region 2 is set to a ground electric potential, and the control gate CG is set to a high voltage. This is a writing or programming operation. In this operation, the memory cell is set to a state of "0" data where the threshold voltage becomes higher by injecting the electrons. When drawing the electrons away from the floating gate, the drain region 3 is set to a floating state, and the source region 2 is set to a high electric potential, and the control gate CG is set to a low or negative electric potential. As a result, the electrons accumulated in the floating gate FG are drawn away to the source region 2, thus lowering the threshold voltage. This is an erasing operation. The memory cell is set to a state of "1" data by drawing the electrons.

There is a difference between electron exchange capabilities of the memory cells Q2 and Q3 shown in FIG. 1. That is, there is a difference of capabilities of drawing the charges away from the floating gate or capabilities of injecting the charges to the floating gate. In the example of FIG. 1, a P type impurity is additionally ion-injected to the channel region 4 of the memory cell Q2, and an region where the source region 2 and the floating gate FG are overlapped is formed to be smaller than that of the memory cell Q3, for example. According to the difference of the structure due to the difference of the impurity concentration, a difference on the speed for drawing electrons to the source region 2, i.e., charge exchange capability, exists. In other words, when the source regions are set to a high electric potential and the erase pulses for setting the control gate CG to a low or negative electric potential are applied to the both memory cells Q2 and Q3 from a state of "0" data, the applying the same number of erase pulses yields a difference of amounts of drawn electrons between the memory cells Q2 and Q3. Therefore, the difference of the amounts of the electrons in the floating gates can be read out as the difference of threshold voltage.

Figure 2:
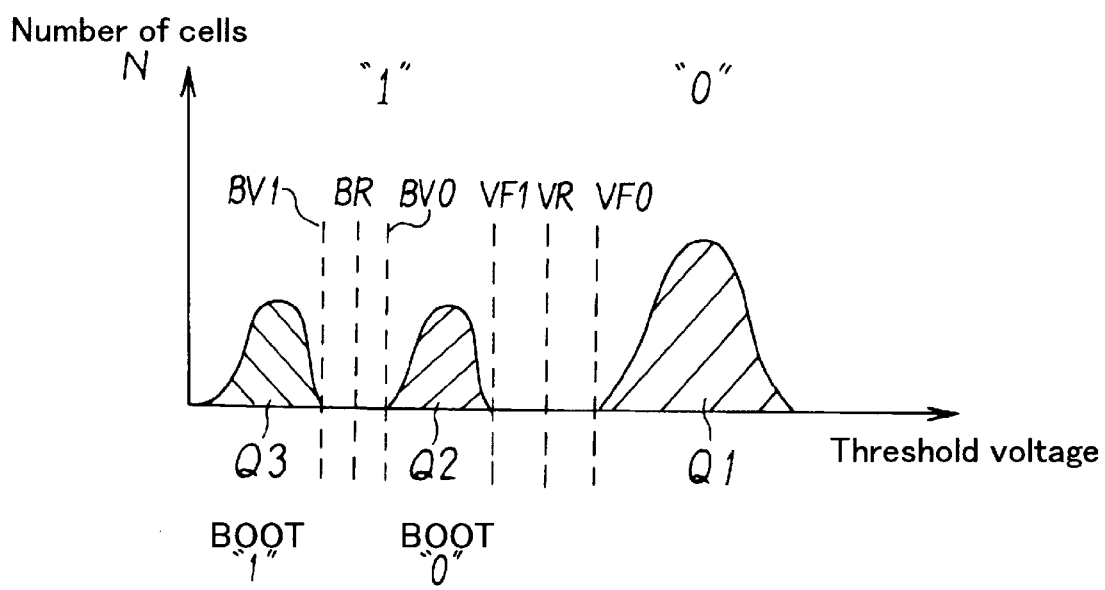
FIG. 2 is a graph showing distributions of thresholds of memory cells having different charge exchange capability and memory cells in a normal programmed or erased state.

FIG. 2 is a graph showing threshold distribution of memory cells each of which charge exchange capability is different and memory cells in a normal programmed or erased state. FIG. 2 shows the threshold voltage of the memory cell on the horizontal axis and the number of memory cells on the vertical axis. In the graph of FIG. 2, a read-out voltage VR, a write verification level VF0, and an erasure verification level VF1 for a normal operation, and a read-out voltage BR, "0" verification level BV0, and "1" verification level BV1 for initial data due to the charge exchange capability are shown.

Each memory cell shown in FIG. 1 has a state of "0" data where the threshold voltage is higher by programming to inject the electrons to the floating gate, and a state of "1" data where the threshold voltage is lower by erasing to draw the electrons away from the floating gate. In other words, the threshold voltage of the memory cell within the distribution Q1 is higher than the "0" write verification level VF0. Further, the threshold voltages of the memory cells within the distributions Q2 and Q3 are lower than the "1" erasure verification level VF1. Therefore, it is possible to distinguish a conductive state of memory cell and a non-conductive state according to the stored data, by applying the normal read-out voltage VR to the control gate CG.

When once data "0" is written to the memory cells Q2 and Q3 and then the erasure pulses for drawing away the electrons from the floating gate are applied for the same amount, the memory cell Q2 moves into the distribution of higher threshold voltage, and the memory cell Q3 moves into the distribution of lower threshold voltage, according to the difference of the charge exchange capabilities, i.e., the charge drawing capability, of the memory cells. It is possible to distinguish the conductive state of memory cell and the non-conductive state of the memory cell according to the stored data of the charge exchange capability difference, by applying the read-out voltage BR for initial data to the control gate.

That is, the storage data according to the charge exchange capability can be read out, when the all erase operation is completed after the all write operation, by applying the initial data read-out voltage BR. And the stored data of the normal program or erase can be read-out by applying the normal read-out voltage VR. Additionally, the storage data according to the charge exchange capability can be returned even after the normal program operation, by all erase operation after the all write operation.

It is also possible to store data permanently in the memory cells Q2 and Q3 of FIG. 1 by using the difference of an electron injection capability to the floating gate.

Figure 3:
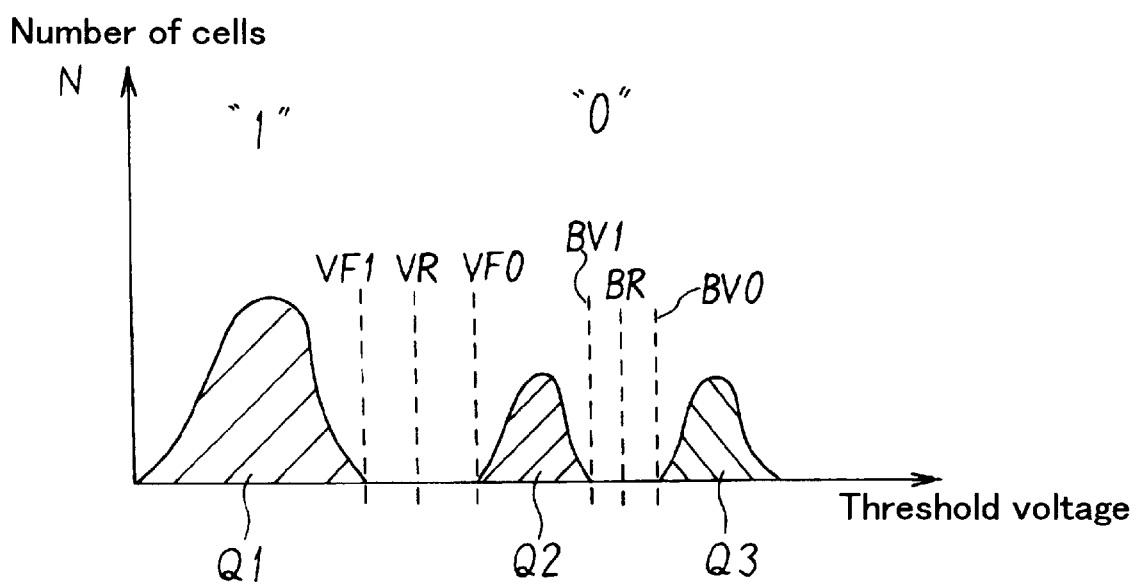
FIG. 3 is a graph showing distributions of threshold voltages, when employing a difference of electron injecting capability.

FIG. 3 is a graph showing distributions of the threshold voltages when employing the difference of the electron injection capability. In this example, the memory cells of the distributions Q2 and Q3 are in a state where "0" data is stored by a normal writing operation, and the memory cell of the distribution Q1 is in a state where "1" data is stored by a normal erasing operation. The data can be read out by applying the normal read-out voltage VR to the control gate.

To return the over-written initial data, an erase operation is executed for both memory cells Q2 and Q3 so as to move to Q1, and the same write pulses are applied to both memory cells Q2 and Q3 from the state of the distribution Q1 shown in FIG. 3. In this case, the memory cell Q3 has higher electron injection capability, thus the change of the threshold voltage is larger, while the memory cell Q2 has lower electron injection capability, thus the change of the threshold voltage is smaller. It is possible to read out the initial data by employing the difference of the changes of the threshold voltages and applying the read-out voltage BR for initial data to the control gates.

In this way, it is defined in the embodiments of the present invention that the charge exchange capability means capability of drawing electrons away from a floating gate or a capability of injecting electron to the floating gate. For example, it is possible to differ the capability of drawing the electron away from, or the capability of injecting the electrons by differing the impurity concentrations of the channel regions.

Figure 4:
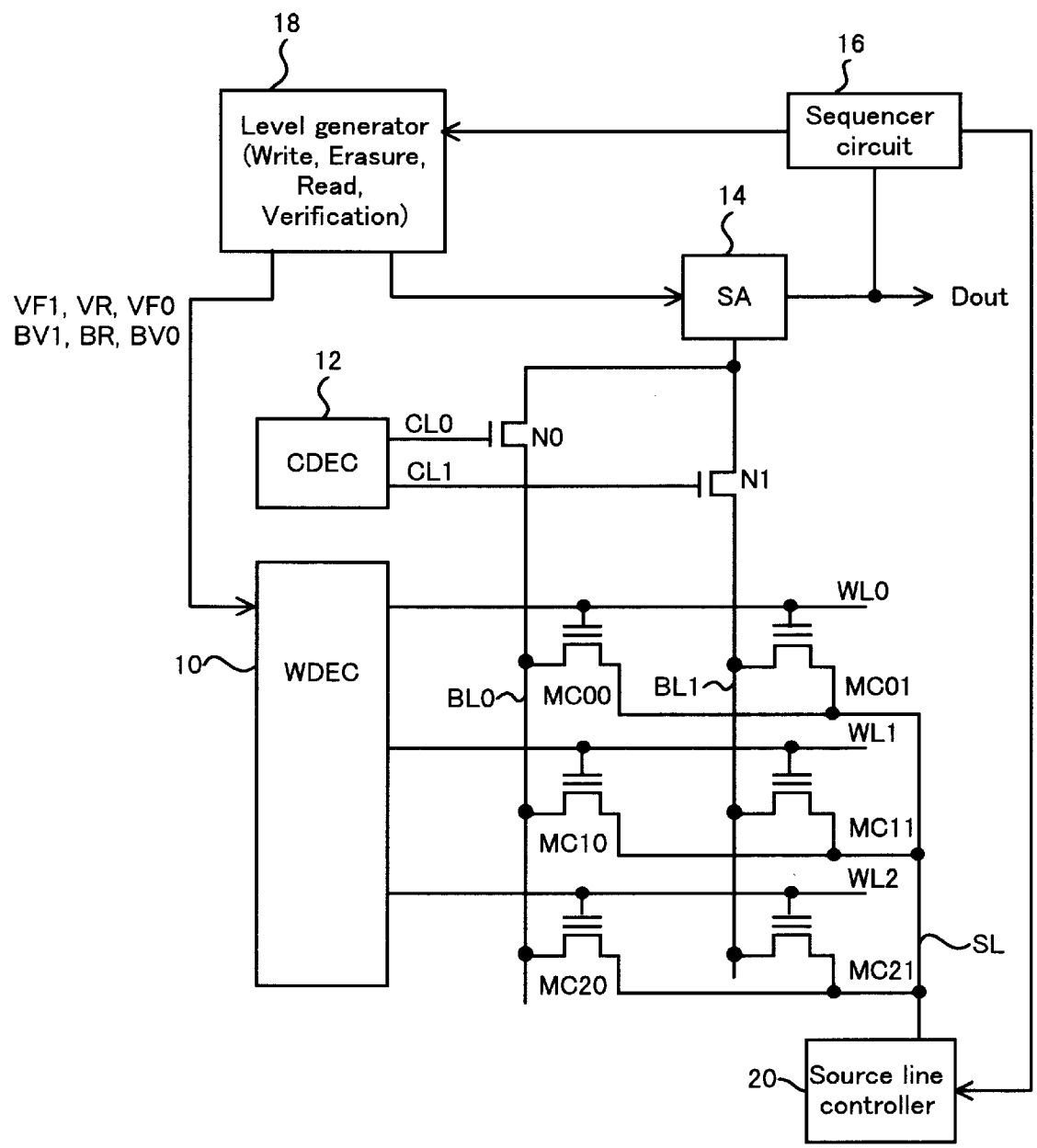
FIG. 4 is a structural diagram of a flash memory according to an embodiment.
Figure 5:
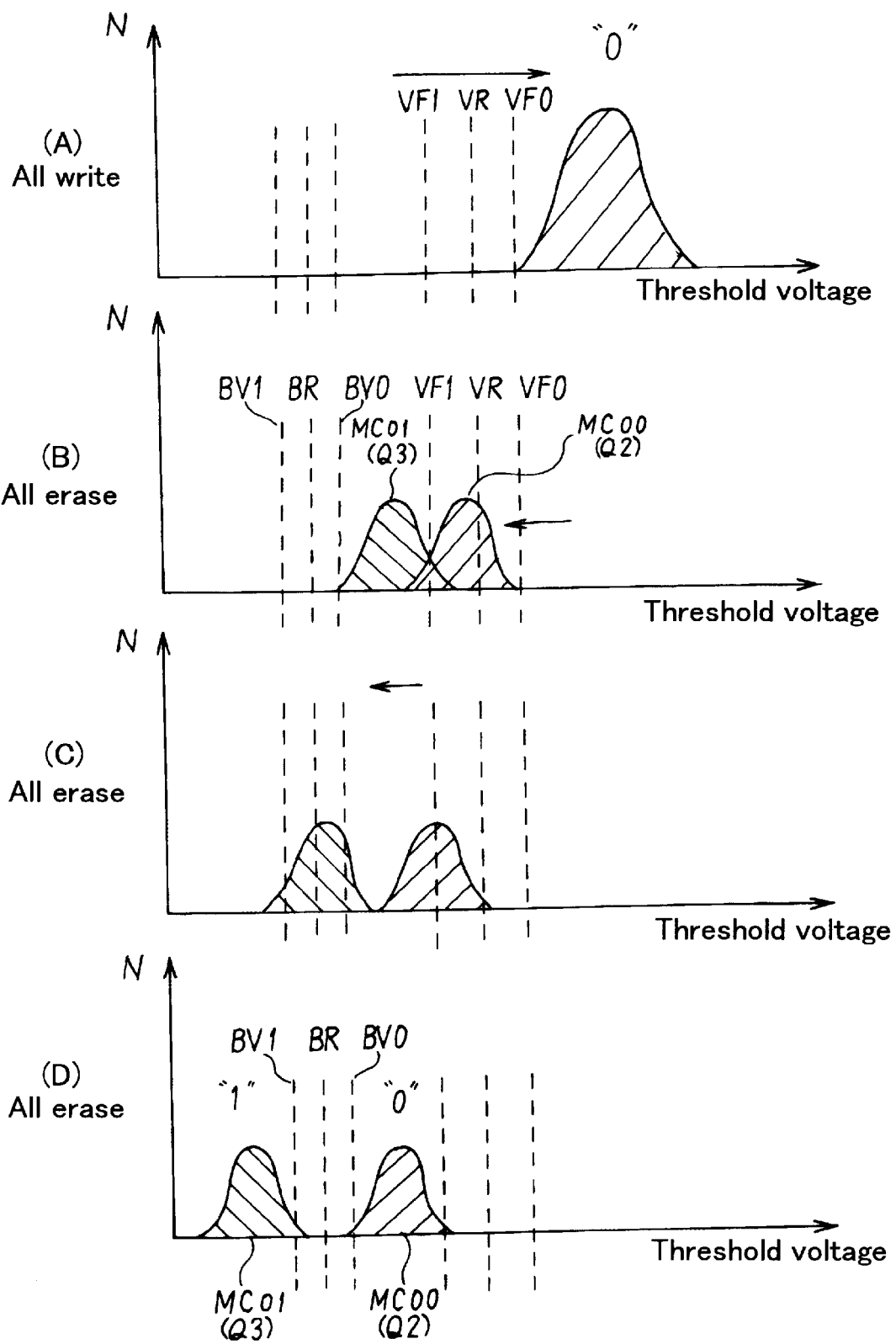
FIGS. 5A, 5B, 5C and 5D show changing of the threshold distribution when returning the initial data.

FIG. 4 is a structural diagram of a flash memory according to the embodiment of the present invention. The flash memory is formed by EEPROMs having floating gates. The flash memory includes memory cells MC00 to MC21 having floating gates provided at each intersection point between plural word lines WL0 to WL2 and plural bit lines BL0 and BL1. The control gates of the memory cells are connected to the word lines WL0 to WL2, the drains are connected to the bit lines BL0 and BL1, and the sources are connected to a common source line SL.

The word lines WL are selected by a word decoder 10 and is driven to a potential given by a level generation circuit 18. And, the bit lines BL are connected to a sense amplifier 14 via a column gate transistors N0, N1. Either column gate transistors N0 or N1 becomes conductive in response to column selection signals CL0 and CL1 selected by a column decoder 12, and the sense amplifier 14 detects a state of current flowing to the bit lines BL. The source line SL is controlled to a predetermined potential by a source line controller 20.

A sequencer circuit 16 controls the writing (programming), erasing and reading operation to the level generator 18 and the source line controller 20. The sequencer circuit 16 also controls the all write, erase and read operation, for returning initial data. In this case, the read voltage BR for initial data applied to the word line WL in the reading operation is different from the read-out voltage VR in a normal reading operation. Further, a write and erasure verification levels BV1, BV0 applied to the word lines differs from the normal operation VF1, VF0 as shown in FIGS. 2 and 3.

FIGS. 5A, 5B, 5C and 5D show changes of the distribution of the threshold voltages, when returning the initial data. An example shown in FIG. 5 is applicable to the case of FIG. 2. In the flash memory shown in FIG. 4, it is assumed that the memory MC00 is set to a lower charge exchange capability similarly to the cell Q2 of FIG. 2, and the memory cell MC01 is set to a higher charge exchange capability similarly to the cell Q3. That is, initial data "0, 1" are respectively stored in the memory cells MC00 and MC01. The other memory cells MC10 to MC21 are assumed to be set to the state of cell Q3. Therefore, in the above-described example, a P type impurity ion are injected to a channel region of the memory cell MC00. The remaining memory cells have the same structure as that of the conventional memory cell.

In a normal writing or erasing operation, the threshold voltage is controlled to a high level by injecting the electron to the floating gate FG or the threshold voltage is controlled to a low level by drawing the electrons. In this case, the "0" verification level VF0 and "1" verification level VF1 shown in FIG. 2 are employed as verification levels It is assumed that first initial data is lost by executing a writing operation for the memory cells MC00 and MC01. To return the initial data "0,1", all writing is executed at first, as shown in FIG. 5A, to set the threshold voltage to a higher level than the write verification level VF0. Next, the same erase pulse is applied to the memory cells MC00 and MC01 where the initial data to be returned is stored, as shown in FIG. 5B. As a result, the memory cell MC01 is changed to a lower threshold voltage and the memory cell MC00 is changed to a threshold voltage higher than that of the memory cell MC01, according to the difference of electron drawing capability.

When continuing to apply the erase pulse to the memory cells, the difference between the threshold voltages becomes larger as they become lower, as shown in FIG. 5C, and finally, the threshold voltage of the memory cell MC01 becomes lower than the verification level BV1, and the threshold voltage of the memory cell MC00 is higher than the verification level BV0.

Then, the memory cell MC00 does not become conductive, and the memory cell MC01 becomes conductive, when the read-out voltage BR for initial data is applied to the word line WL0. The sense amplifier 14 can detect the initial data according to this presence or absence of current of the bit lines due to the conductive or non conductive state.

In the above-described example, the initial data is read out in the state of FIG. 5D. Therefore, it is required to generate, for reading out the initial data, levels BR, BV0 and BV1 for initial data, which are different from the normal read-out level VR or the verification levels VF0 and VF1. To do that, reference transistors, not shown in the diagram, must be increased in the sense amplifier 14.

A reading operation can be also executed by employing the erasure verification level VF1 in the state shown in FIG.

5B as the other reading method of the initial data. In this case, since an overlapped portion of the distributions of the threshold voltages of the memory cells having the initial data exists, there is a high possibility to include errors in the read data. In this case, it is possible to prevent the error occurrence by storing the error correction code (ECC) in addition to storing the initial data. It is preferable to store data not only parity codes for error detection but also error correction codes.

Additionally, it is also possible to prevent from an error occurrence of the read-out data by employing error correction codes in the same way, even when the overlapped portion exists on both distributions in the state of FIG. 5D.

Figure 6:
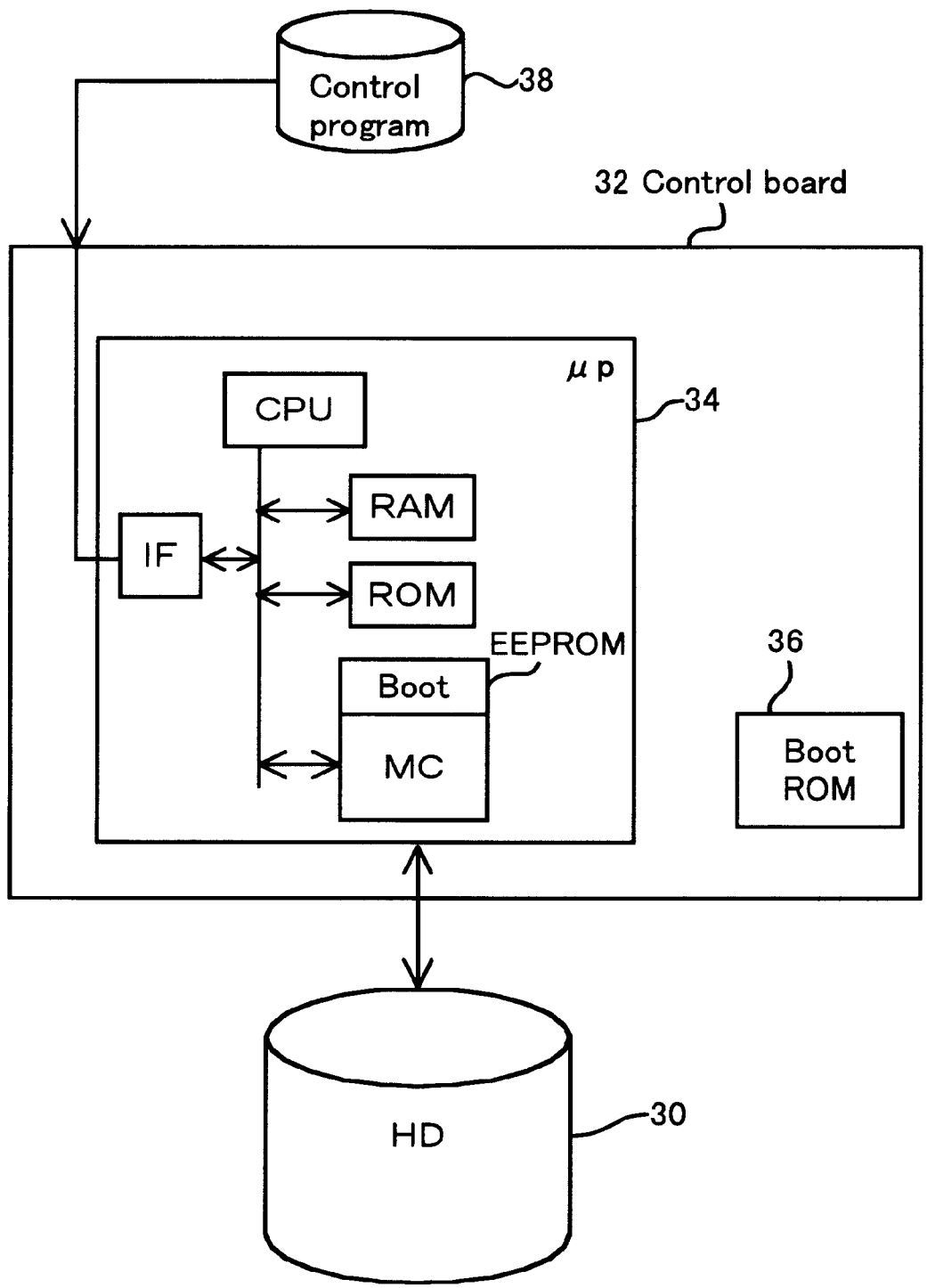
FIG. 6 shows an applicable example of a flash memory according to an embodiment.

FIG. 6 is an applicable example of a flash memory according to the embodiments of the present invention. In the applicable example, a flash memory (EEPROM) is embedded a micro processor 34 for controlling a large capacity storage medium 30, such as a hard disk. The micro processor 34 is provided on a control board 32 of the hard disk 30. The micro processor 34 where a flash memory EEPROM is built-in further includes a CPU, RAM and ROM. The flash memory EEPROM stores a boot program Boot for starting at the time when down loading the control program. The boot program is written in a returnable memory cell region after over-write. The flash memory includes a normal memory cell region MC either.

A developed control program 38 is down loaded in the flash memory EEPROM of the micro processor 34. The CPU starts the boot program stored in the flash memory and executes the boot program to down load the control program. The control program 38 is down loaded in the flash memory 38, in response to the boot program execution. In this case, the control program 38 has data amount approximately equal to the capacity of the flash memory, and the control program 38 is also over-written in the boot program Boot region at the down loading time.

Therefore, it is required to return the boot program data, which is initial data, when the down loaded control program must be changed. This is because the data can not be written by an externally provided writer, after mounting the micro processor 31 on the printed circuit board 32.

FIG. 7 is a flow chart when returning the boot program in the applicable example of FIG. 6. The flash memory is in the state shown in FIG. 5D where the boot program is stored in. At first, a word line level is set to the read-out level BR for reading out the boot data to read the boot program stored in the flash memory (S1). Next, the CPU reads the boot program and down loads the control program 38 (S2). When the down loading is not succeed (S3), or the program should be changed after the down loading is succeed (S4), all write operation is executed in the boot program storage region of the flash memory (S5). As a result, the flash memory becomes the state of FIG. 5A.

Then, the erase pulse is applied to the region little by little (S6), and the erasing operation is continued to execute until the level becomes less than a predetermined verification level (S7). As a result, the flash memory returns to the state of FIG. 5D. After that, the control program to be changed or the control program, which is failed to down load, is down loaded again by reading and executing the boot program again.

When the control program is successfully down loaded and the control program is not changed, the CPU of flash memory executes a normal reading operation. Therefore, the word line level is set to a normal reading level VR (S8) and a normal reading operation is executed (S9).

As is explained above, it is possible to return over-written initial data easily in a flash memory of the above embodiments. Therefore, it is preferable to record a program or data, like a boot program, which is used at an initial stage and is over-written into other data.

As described above, according to the present invention, a non-volatile semiconductor storage device where initial data can be returned easily even after another data is over-written in an region where an initial data is stored in can be provided.

What is claimed is:

1. A non-volatile semiconductor memory comprising:
    a plurality of non-volatile memory cells, each non-volatile memory cell including a floating gate into which electric charges may be accumulated,
    said plurality of non-volatile memory cells including at least
    a first memory cell type having a first charge exchange capability with respect to exchanging electric charges of a corresponding floating gate; and
    a second memory cell type having a second charge exchange capability, which is higher than the first charge exchange capability,
    wherein a first data is stored in said one of the non-volatile memory cells based on whether electric charges are accumulated in a corresponding floating gate, and a second data different from the first data is stored in said one of the non-volatile memory cells based on whether the non-volatile memory cell is of the first or second memory cell type.

2. The non-volatile semiconductor memory according to claim 1,
    wherein each of the plural of non-volatile memory cells are formed at a surface of a first conductive type sem-conductor substrate, and each non-volatile memory cell includes second conductive type source and drain regions formed at the surface of the semiconductor substrate, with the corresponding floating gate being formed over a first conductive type channel region between the source and drain regions, and a control gate being formed over the corresponding floating gate,
    wherein a channel region of the first memory cell type has a different impurity concentration than a channel region of the second memory cell type.

3. The non-volatile semiconductor memory according to claim 1, wherein eah of the plurality of non-volatile memory cells includes a control gate over a corresponding floating gate, and each non-volatile semiconductor memory further includes a read level generator to apply a first read electric potential to a corresponding control gate during a first data read operation and to apply a second read electric potential, which is different from the first read electric potential, to the corresponding control gate during a second data read operation different from the first data read operation.

4. A non-volatile semiconductor memory having a plurality of non-volatile memory cells, each non-volatile memory cell including a floating gate into which electric charges may be accumulated, comprising:
    a first non-volatile memory area including a first memory cell type having a first charge exchange capability with respect to exchanging electric charges of a corresponding floating gate, and a second memory cell type having a second charge exchange capability, which is higher than the first charge exchange capability, wherein a first data is stored in the first non-volatile memory area based on whether electric charges are accumulated in the corresponding floating gate, and a second data different from the first data is stored in the first non-volatile memory area based on whether the non-volatile memory cell therein is of the first or second memory cell type; and a second non-volatile memory area including either first memory cell types or second memory cell types, wherein a third data is stored in the second non-volatile memory area based on whether the electric charges are accumulated in a corresponding floating gate.

5. The non-volatile semiconductor memory according to claim 4, wherein each of the non-volatile memory cells includes a control gate over a corresponding floating gate, in the first non-volatile memory area, the first data is read out by applying a first read electric potential to a corresponding control gate during a first reading operation, and the second data is read out by applying a second read electric potential, different from the first read electric potential, to the corresponding control gate during a second reading operation different from the first reading operation.

6. The non-volatile semiconductor memory according to claim 5, wherein the first and the second memory cell types of the first non-volatile memory area have threshold voltages according to the first and second charge exchange capabilities, respectively, by erasing or programming all of the non-volatile memory cells in the first non-volatile memory area.

7. The non-volatile semiconductor memory according to claim 4, wherein the second data includes an error detection code, and the second data is read out by employing the error detection code when reading the second data.

8. A micro processor having a non-volatile memory area including plural non-volatile memory cells for storing data by accumulating charges in a corresponding floating gate of each non-volatile memory cell, the non-volatile memory area comprising:

a first non-volatile memory area including a first memory cell type having a first charge exchange capability with respect to exchanging the electric charges of the corresponding floating gate, and a second memory cell type having a second charge exchange capability, which is higher than the first charge exchange capability, wherein a first data is stored in the first non-volatile memory area based on whether electric charges are accumulated in the corresponding floating gate, and a second data different from the first data is stored in the first non-volatile memory area based on whether the non-volatile memory area therein is of the first or second memory cell type; and a second non-volatile memory area including either first memory cell types or second memory cell types, wherein a third data is stored in the second non-volatile memory area based on whether the electric charges are accumulated in the corresponding floating gate, wherein the second data includes a boot program for down-loading data into the first or second non-volatile memory area.

9. The non-volatile semiconductor memory according to claim 1, wherien each of the non-volatile memory cells includes a control gate over a corresponding floating gate, and wherein the first data is read out by applying a first read electric potential to a corresponding control gate during a first reading operation, and the second data is read out by applying a second read electric potential, different from the first read electric potential, to the corresponding control gate during a second reading operation different from the first reading operation.

10. The non-volatile semiconductor memory according to claim 9, wherein the first and second memory cell types of the first non-volatile memory area have threshold voltages according to the first and second charge exchange capabilities, respectively, by erasing or programming all of the non-volatile memory cells.

11. The non-volatile semiconductor memory according to claim 1, wherein the second data includes an error detection code, and the second data is read out by employing the error detection code when reading the second data.

12. A micro processor having a non-volatile memory area including plural non-volatile memory cells for storing data by accumulating charges in a corresponding floating gate of each non-volatile memory cell, the non-volatile memory area, comprising:

a first memory cel type having a first charge exchange capability with respect to exchanging the electric charges of the corresponding floating gate, and a second memory cell type having a second charge exchange capability, which is higher than the first charge exchange capability, wherein a first data is stored in the first non-volatile memory area based on whether electric charges are accumulated in the corresponding floating gate, and a second data different from the first data is stored in the first non-volatile memory area based on whether the non-volatile memory area therein is of the first or second memory cell type, wherein the second data includes a boot program for down-loading data into the non-volatile memory area.

* * * * *

UNITED STATES PATENT AND TRADEMARK OFFICE
CERTIFICATE OF CORRECTION

PATENT NO. : 6,327,186 B1
DATED : December 4, 2001
INVENTOR(S) : Ikuto Fukuoka

Page 1 of 1

It is certified that error appears in the above-identified patent and that said Letters Patent is hereby corrected as shown below:

Title page,
Item [57] ABSTRACT,
Change "cell scan" to -- cells can --.

Column 8,
Line 36, change "sem-conductor" to -- semiconductor --.

Column 10,
Line 40, change "cel" to -- cell --.

Signed and Sealed this

Nineteenth Day of March, 2002

*Attest:*

JAMES E. ROGAN
*Attesting Officer*   *Director of the United States Patent and Trademark Office*